United States Patent
Huang et al.

(10) Patent No.: US 6,313,028 B2
(45) Date of Patent: *Nov. 6, 2001

(54) METHOD OF FABRICATING DUAL DAMASCENE STRUCTURE

(75) Inventors: Chao-Yuan Huang; Juan-Yuan Wu, both of Hsinchu; Water Lur, Taipei, all of (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/280,892

(22) Filed: Mar. 29, 1999

(51) Int. Cl.$^7$ .................. H01L 21/44; H01L 21/4763
(52) U.S. Cl. .................. 438/637; 438/597; 438/631; 438/675; 438/687
(58) Field of Search ................. 438/638, 640, 438/687, 627, 631, 637, 641, 674, 597

(56) References Cited

U.S. PATENT DOCUMENTS

| | | | |
|---|---|---|---|
| 5,674,787 | * | 10/1997 | Zhao et al. |
| 5,897,369 | * | 4/1999 | Jun ..................... 438/629 |
| 5,969,422 | * | 10/1999 | Ting ..................... 257/762 |
| 6,008,114 | * | 12/1999 | Li ........................ 438/618 |
| 6,025,264 | * | 2/2000 | Yew et al. ............ 438/627 |
| 6,027,994 | * | 2/2000 | Huang et al. ........ 438/618 |
| 6,037,664 | * | 3/2000 | Zhao ..................... 257/758 |
| 6,130,156 | * | 10/2000 | Havermann et al. . 438/637 |
| 6,150,269 | * | 11/2000 | Roy ....................... 438/687 |
| 6,156,642 | * | 12/2000 | Wu et al. .............. 438/637 |
| 6,184,126 | * | 2/2001 | Lee et al. .............. 438/637 |
| 6,187,670 | * | 2/2001 | Brown et al. ......... 438/638 |
| 6,197,678 | * | 3/2001 | Yu ........................ 438/627 |
| 6,204,179 | * | 3/2001 | McTeer ................. 438/687 |
| 6,211,085 | * | 4/2001 | Liu ....................... 438/687 |

* cited by examiner

Primary Examiner—Matthew Smith
Assistant Examiner—Chuong A. Luu
(74) Attorney, Agent, or Firm—Thomas, Kayden, Horstemeyer & Risley

(57) ABSTRACT

A method of fabricating a dual damascene is provided. A dielectric layer is formed on a substrate. A diffusion barrier layer is formed on the dielectric layer. A portion of the diffusion barrier layer and the dielectric layer is removed to form a trench and a via hole. A barrier layer is formed on the diffusion barrier layer and in the trench and the via hole. The barrier layer on the diffusion barrier layer is removed by chemical-mechanical polishing. A conductive layer is formed in the trench and the via hole by selective deposition. A planarization step is performed with the diffusion barrier layer serving as a stop layer.

20 Claims, 3 Drawing Sheets

METHOD OF FABRICATING DUAL DAMASCENE STRUCTURE

BACKGROUND OF THE INVENTION

1. Field of the Invention

The present invention relates to a fabricating method of multi-layered interconnections. More particularly, the present invention relates to a method of fabricating a dual damascene structure.

2. Description of the Related Art

Due to the increased number of devices incorporated in a semiconductor circuit and the corresponding size reduction of the devices, material property is an important factor that affects device performance. For example, the material of the metallic multi-layered interconnections greatly affects resistance of the devices. Thus, in order to reduce the resistance, it is an important subject to select a suitable metallic material.

Copper has many good qualities such as a low resistivity and a high electromigration resistance. In addition, copper can be formed by chemical vapor deposition (CVD) or electroplating. Thus, copper is widely used in sub-micron process to form multi-layered interconnects. However, some problems still occur when using copper in sub-micron process. For example, copper is easily oxidized and eroded. It is difficult to pattern copper by dry etching. The adhesion between copper and dielectric materials is poor. Furthermore, copper easily diffuses into the dielectric materials so that the reliability of devices is decreased.

To solve the above-described problems, the conventional method uses a dual-damascene technique with a chemical-mechanical polishing step. FIGS. 1A through 1C are schematic, cross-sectional views showing a conventional method of fabricating a dual damascene structure. A dual-damascene technique is a technique that forms a metallic interconnection 114 (FIG. 1B) in a dielectric layer 106. In FIG. 1A, a dielectric layer 106 is first formed over a substrate 100, and then the dielectric layer 106 is planarized. According to the required design, the dielectric layer 106 is then patterned. A trench 108 and a via hole 110 are formed to expose a portion of the conductive layer 102. In FIG. 1B, a barrier layer 112 is formed over the substrate 100. A copper layer 114 is formed over the substrate 100 to fill the trench 108 and the via hole 110. A conductive line and a via contact are thus simultaneously formed.

The barrier layer 112 having a high stability is used to solve the above-described problems, such as copper atom diffusion and poor adhesion between the copper layer 114 and the dielectric layer 106. As shown in FIG. 1C, a chemical-mechanical polishing (CMP) step is performed. Because it is difficult to etch the copper layer 114, the conventional method solves this difficulty by using the CMP step instead of performing an etching step. Thus, the difficulty in etching the copper layer 114 does not occur.

Typically, the material of the barrier layer 112 in the dual damascene structure is tantalum/tantalum nitride (Ta/TaN). Because it is difficult to remove the Ta/TaN layer by chemical-mechanical polishing, the dual damascene structure is still formed with difficulty. In order to remove the barrier layer 112, it is necessary for the conventional method to perform an over-polishing step. Since the etching rate for the Ta/TaN barrier layer 112 is lower than that of the copper layer 114, the copper layer 114 is easily dished or suffers from an erosion problem. Thus, the process is still not optimal.

SUMMARY OF THE INVENTION

The invention provides a method of fabricating a dual damascene structure. A dielectric layer is formed on a substrate. A diffusion barrier layer is formed on the dielectric layer. A portion of the diffusion barrier layer and the dielectric layer is removed to form a trench and a via hole. A barrier layer is formed on the diffusion barrier layer and in the trench and the via bole. The barrier layer on the diffusion barrier layer is removed by chemical-mechanical polishing. A conductive layer is formed in the trench and the via hole by selective deposition. A planarization step is performed with the diffusion barrier layer serving as a stop layer.

During the selective deposition of the conductive layer, the barrier layer serves as an activation center for selective deposition. The conductive layer easily fills the trench and the via hole. In contrast, since the diffusion barrier layer does not serve as an active center, it is difficult to deposit the conductive layer on the diffusion barrier layer. Thus, there is a high selectivity of the conductive layer between the barrier layer and the diffusion barrier layer.

The invention removes the barrier layer, which is on the diffusion barrier layer, before the step of forming the conductive layer in the trench and the via hole. The conductive layer is then formed by selective deposition. There is a high selectivity between the barrier layer, which is in the trench and the via hole, and the diffusion barrier layer. Thus, the conductive layer is deposited almost only in the trench and the via hole. Therefore, the undesired conductive layer on the diffusion barrier layer can be easily removed by chemical-mechanical polishing, so as to prevent the occurrence of a dishing effect and a erosion problem of the conductive layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
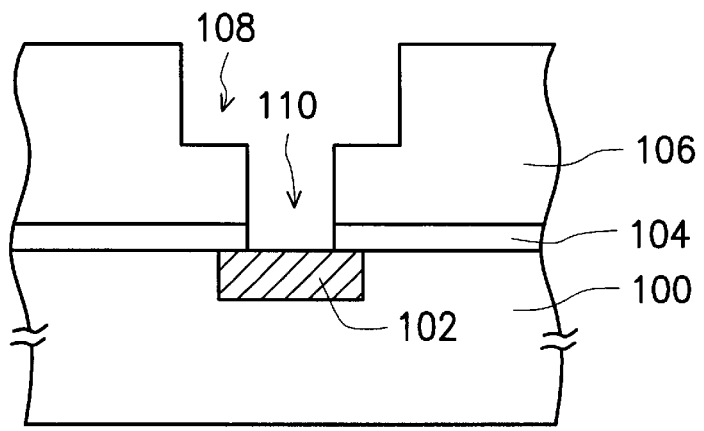
FIGS. 1A through 1C are schematic, cross-sectional views showing a conventional method of fabricating a dual damascene structure.
Figure 1B:
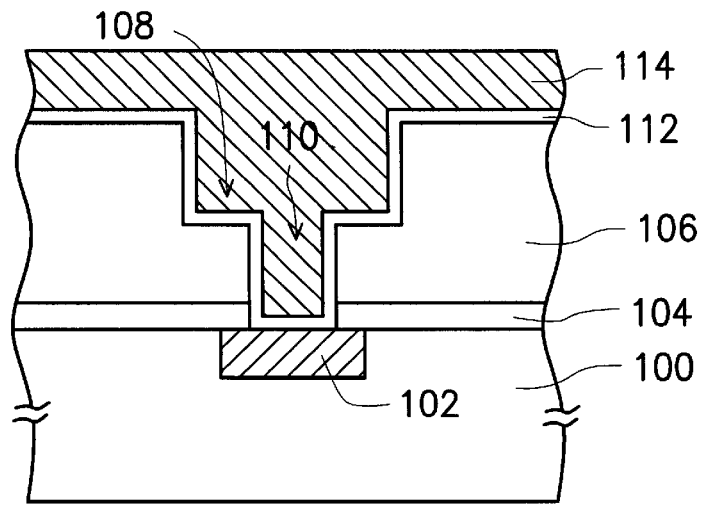
Figure 1C:
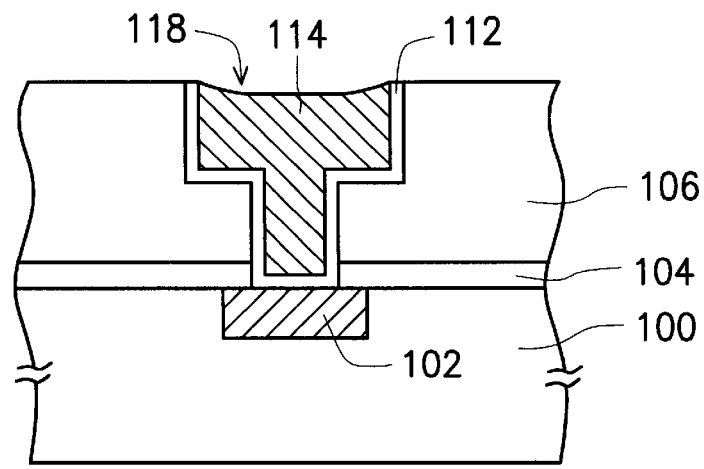

Reference will now be made in detail to the present preferred embodiments of the invention, examples of which are illustrated in the accompanying drawings. Wherever possible, the same reference numbers are used in the drawings and the description to refer to the same or like parts.

The preferred embodiment takes a dual damascene as an example to explain the present invention. In practice, the invention can also be utilized in a process of forming a metallic line or a process of forming a contact or a via. The present invention is not limited to the method of forming a dual damascene structure.

FIGS. 2A through 2F are schematic, cross-sectional views showing a method of fabricating a dual damascene structure according to one preferred embodiment of the invention.

Figure 2A:
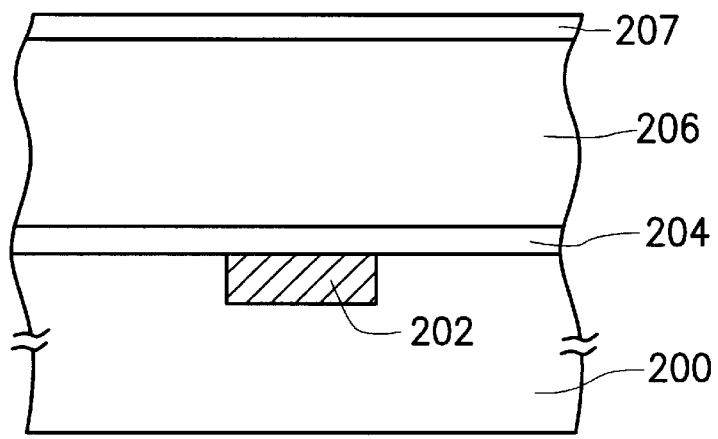
FIGS. 2A through 2F are schematic, cross-sectional views showing a method of fabricating a dual damascene structure according to one preferred embodiment of the invention.

In FIG. 2A, a conductive layer 202 is formed in the substrate 200. A cap layer 204 is formed on the substrate 200 to cover the conductive layer 202. A dielectric layer 206 and a diffusion barrier layer 207 are formed in sequence over the substrate 200.

The material of the conductive layer 202 includes copper. The conductive layer 202 can be formed by chemical vapor deposition or electroplating. The thickness of the conductive layer 202 is preferably about 3000 angstroms to 5000 angstroms, but is not limited to this thickness. The material of the cap layer 204 is preferably a material that can prevent the oxidation of the conductive layer 202 and can also prevent atoms or ions of the conductive layer 202 from diffusing into the dielectric layer 206. The thickness of the cap layer 204 is preferably about 600 angstroms to 1000 angstroms. In a case where a material of the conductive layer 202 is copper, the material of the cap layer 204 is preferably silicon nitride (SiN) and SiC formed by, for example, chemical vapor deposition.

The dielectric layer 206 is preferably a silicon oxide layer formed by plasma-enhanced chemical vapor deposition (PECVD), or spin-on polymer (SOP) with a low dielectric constant. The SOP includes flare, SILK, Parylene, or PAE-II.

The diffusion barrier layer 207 is used to prevent the conductive layer 202 from diffusing into the dielectric layer 206 while depositing the conductive layer 202. There is a deposition selectivity between the diffusion barrier layer 207 and the dielectric layer 206 while depositing the conductive layer 214. The material of the diffusion barrier layer 207 is preferably silicon nitride formed by, for example, chemical vapor deposition.

Figure 2B:
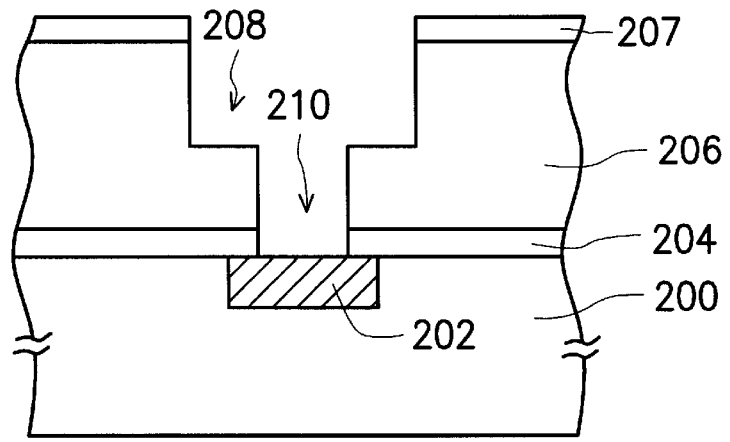

In FIG. 2B, a trench 208 and a via hole 210 are formed in the diffusion barrier layer 207, the dielectric layer 206, and the cap layer 204 by the following exemplary steps. A patterned photoresist layer (not shown) comprising an opening is formed over the diffusion barrier layer 207. The location of the opening exposes the location of the via hole 210 above the conductive layer 202. An etching step is performed with the cap layer 204 serving as an etching stop point. The pattern of the photoresist layer is transferred to form the via hole 210. A via hole 210 exposing the cap layer 204 is formed in the diffusion barrier layer 207 and the dielectric layer 206. The photoresist layer is removed. Another photoresist layer (not shown) is formed on the dielectric layer 206, so as to form the trench 208. The diffusion barrier layer 207 and the dielectric layer 206 are patterned with the photoresist layer serving as an etching mask. A trench 208 is formed in the diffusion barrier layer 207 and the dielectric layer 206. The photoresist layer is removed. The cap layer 204 exposed by the via hole 210 is removed.

Figure 2C:
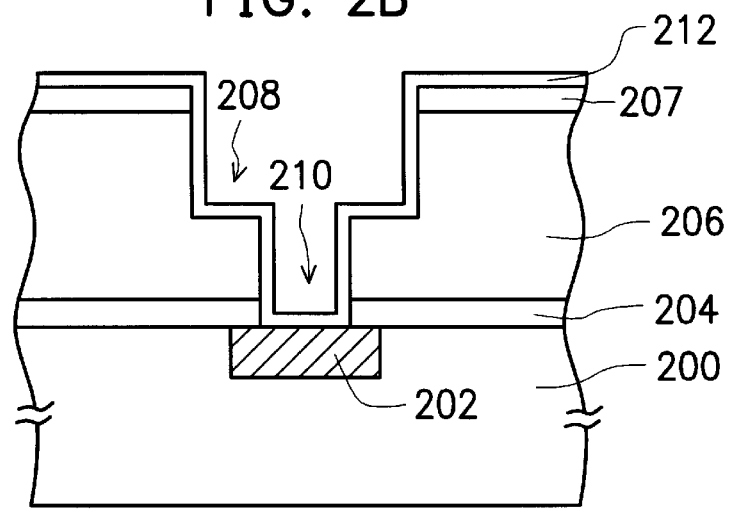

In FIG. 2C, a conformal barrier layer 212 is formed over the substrate 200, in the trench 208 and the via hole 210, and over the diffusion barrier layer 207. Preferably, a material of the barrier layer 212 is titanium/titanium nitride (Ti/TiN), tantalum (Ta), tantalum nitride (TaN), tantalum/tantalum nitride (Ta/TaN), or tungsten nitride.

Figure 2D:
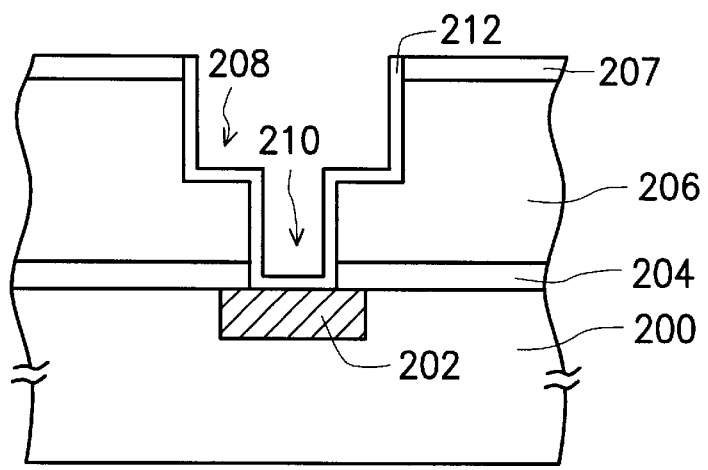

In FIG. 2D, the barrier layer 212 on the diffusion barrier layer 207 is removed. Preferably, a chemical-mechanical polishing step is performed with the diffusion barrier layer 207 serving as an etching stop. The barrier layer 212 is polished until the diffusion barrier layer 207 is exposed.

Figure 2E:
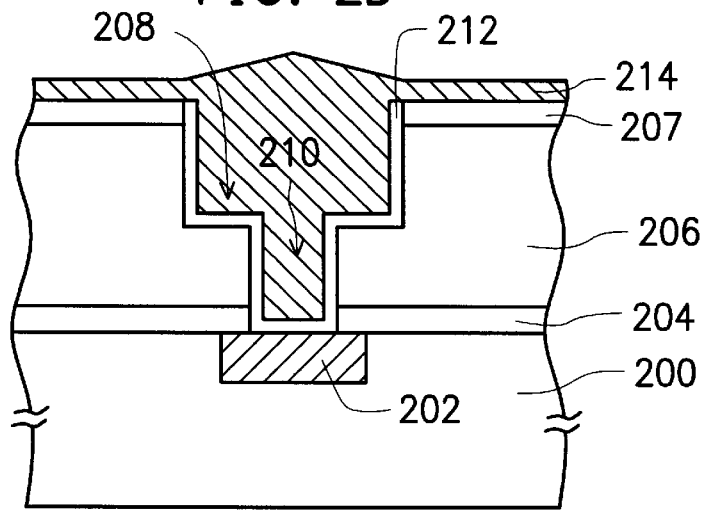

In FIG. 2E, a selective deposition step is performed. A conductive layer 214 is formed over the substrate 200 and in the trench 208 and the via hole 210. The material of the conductive layer 214 is preferably copper. The step of forming the conductive layer 214 is preferably performed by selective deposition, such as selective chemical vapor deposition. In a case where a material of the conductive layer 214 is copper, the material of the barrier layer 212 is preferably Ta/TaN.

The following description takes the following materials as examples: if a material of the conductive layer 214 is copper, a material of the barrier layer 212 is Ta/TaN and a material of the diffusion barrier layer 207 is silicon nitride. During the selective chemical vapor deposition of the copper conductive layer 214, the Ta/TaN barrier layer 212 serves as an activation center for selective chemical vapor deposition. Thus, the copper conductive layer 214 easily fills the trench 208 and the via hole 210. In contrast, since the silicon-nitride diffusion barrier layer 207 does not serve as an active center, it is difficult to deposit the copper conductive layer 214 on the diffusion barrier layer 207. As explained in the above description, there is a high selectivity of the copper conductive layer 214 between the barrier layer 212 and the diffusion barrier layer 207.

Figure 2F:
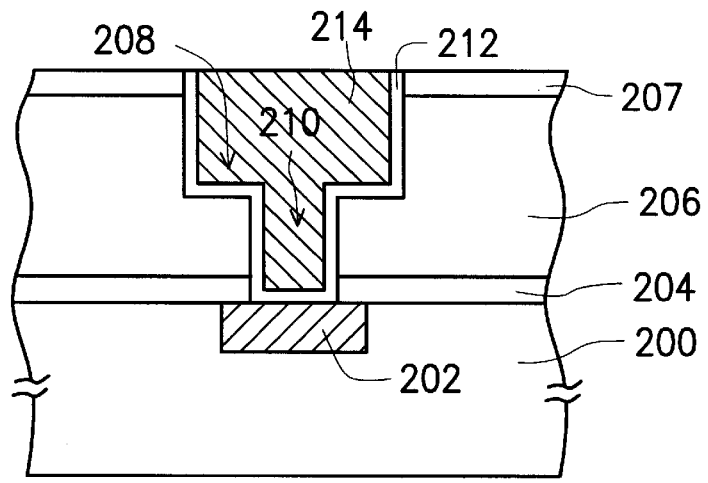

In FIG. 2F, a planarization process is performed to remove a portion of the conductive layer 214. Preferably, a chemical-mechanical polishing is performed with the diffusion barrier layer 207 serving as a stop layer. The conductive layer 214 is removed until the diffusion barrier layer 207 is exposed.

In the invention, a selective ratio of the barrier layer 214 and the diffusion barrier layer 207 is not necessarily 100%. If there is a portion of the conductive layer 214 deposited on the diffusion barrier layer 207, the conductive layer 214 on the diffusion barrier layer 207 can be easily removed in the following planarization process. Thus, a dishing effect and an erosion problem do not occur.

In the conventional method, in order to remove a Ta/TaN barrier layer by chemical-mechanical polishing, a dishing effect and an erosion problem occur on the conductive layer. The invention solves the difficulty by removing the barrier layer 212 on the diffusion barrier layer 207 before the step of depositing conductive layer 214. Thus, when the planarization process is performed to remove a portion of the conductive layer 214, no barrier layer 212 needs to be removed. Thus, the dishing effect and the erosion problem, as found in the conventional method because of over polishing, do not occur.

Accordingly, the invention removes a barrier layer on a diffusion barrier layer before the step of forming a conductive layer in a trench and a via hole. The conductive layer is then formed by selective deposition. There is a high selectivity between the barrier layer, which is in the trench and the via hole, and the diffusion barrier layer. Thus, the conductive layer is deposited almost only in the trench and the via hole. Therefore, the undesired conductive layer on the diffusion barrier layer can be easily removed by chemical-mechanical polishing, so as to prevent the occurrence of the dishing effect and the erosion problem found in the conventional method.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a dual damascene structure, comprising the steps of:
   forming a dielectric layer on a substrate;
   forming a diffusion barrier layer on the dielectric layer;
   removing a portion of the diffusion barrier layer and the dielectric layer to form a trench and a via hole;
   forming a barrier layer without any copper over on the diffusion barrier layer and in the trench and the via hole;
   removing the barrier layer on the diffusion barrier layer outside the trench and the via hole so as to create a high deposition selectivity of the barrier layer to the diffusion barrier layer;
   after removing the barrier layer on the diff-usion barrier layer outside the trench and the via hole, forming a conductive layer in the trench and the via hole; and
   performing a planarization step with the diffusion barrier layer serving as a stop layer.

2. The method of claim 1, wherein the conductive layer comprises copper.

3. The method of claim 2, wherein the conductive layer is formed by selective chemical vapor deposition.

4. The method of claim 2, wherein a material of the diffusion barrier layer is silicon nitride.

5. The method of claim 2, wherein a material of the barrier layer is Ta/TaN.

6. The method of claim 2, wherein the step of removing the barrier layer on the diffusion barrier layer is performed by chemical-mechanical polishing.

7. The method of claim 2, wherein the planarization step comprises chemical-mechanical polishing.

8. The method of claim 1, wherein the conductive layer is formed by selective chemical vapor deposition.

9. The method of claim 1, wherein a material of the diffusion barrier layer is silicon nitride.

10. The method of claim 1, wherein a material of the barrier layer is Ta/TaN.

11. The method of claim 1, wherein the step of removing the barrier layer on the diffusion barrier layer is performed by chemical-mechanical polishing.

12. The method of claim 1, wherein the planarization step comprises chemical-mechanical polishing.

13. A method of fabricating a dual damascene structure, comprising the steps of:
    forming a dielectric layer on a substrate;
    forming a diffusion barrier layer on the dielectric layer;
    removing a portion of the diff-usion barrier layer and the dielectric layer to form a trench and a via hole;
    forming a non-copper barrier layer on the diffusion barrier layer and in the trench and the via hole;
    performing a chemical-mechanical polishing step to remove the non-copper barrier layer on the diffusion barrier layer outside the trench and the via hole so as to create a high deposition selectivity of the non-copper barrier layer to the diffusion barrier layer;
    after removing the non-copper barrier layer on the diffusion barrier layer outside the trench and the via hole, forming a copper layer in the trench and the via hole by selective deposition; and
    performing a planarization process by chemical-mechanical polishing with the diffusion barrier layer serving as a stop layer.

14. The method of claim 13, wherein the step of forming the conductive layer comprises selective chemical vapor deposition.

15. The method of claim 13, wherein the diffusion barrier layer comprises a silicon nitride layer.

16. the method of claim 13, wherein the non-copper barrier layer comprises Ta/TaN.

17. A method of fabricating a dual damascene structure, comprising the steps of:
    forming a dielectric layer on a substrate;
    forming a diffusion barrier layer on the dielectric layer;
    removing a portion of the diffusion barrier layer and the dielectric layer to form a trench and a via hole;
    forming a barrier layer in the trench and the via hole;
    removing the barrier layer on the diffusion barrier layer outside the trench and the via hole;
    after removing the barrier layer on the diffusion barrier layer outside the trench and the via hole, forming a conductive layer in the trench and the via hole; and
    performing a planarization step with the diffusion barrier layer serving as a stop layer.

18. The method of claim 17, wherein a material of the barrier layer is Ta/TiN.

19. The method of claim 17, wherein a material of the diffusion barrier layer is silicon nitride.

20. A method of fabricating a dual damascene structure, comprising the steps of:
    forming a dielectric layer on a substrate;
    forming a dielectric barrier layer on the dielectric layer;
    removing a portion of the dielectric barrier layer and the dielectric layer to form a trench and a via hole;
    forming a barrier layer in the trench and the via hole;
    removing the barrier layer on the dielectric barrier layer outside the trench and the via hole;
    after removing the barrier layer on the dielectric barrier layer outside the trench and the via hole, forming a conductive layer in the trench and the via hole; and
    performing a planarization step with the dielectric barrier layer serving as a stop layer.

* * * * *